(12) United States Patent
Yamada et al.

(10) Patent No.: US 6,551,697 B2
(45) Date of Patent: Apr. 22, 2003

(54) PRINTED CIRCUIT BOARD, METHOD OF MAKING SAME, AND PHOTOMASK FOR USE IN THE METHOD

(75) Inventors: Shinji Yamada, Otsu (JP); Yutaka Tsukada, Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/953,322

(22) Filed: Sep. 14, 2001

(65) Prior Publication Data

US 2002/0034619 A1 Mar. 21, 2002

(30) Foreign Application Priority Data

Sep. 18, 2000 (JP) .......................... 2000-282149

(51) Int. Cl.[7] .............. B32B 3/00; G03C 3/00; G03C 5/00
(52) U.S. Cl. ............... 428/209; 430/11; 430/14; 430/18; 430/313
(58) Field of Search ............ 428/209; 430/18, 430/313, 11, 14

(56) References Cited

U.S. PATENT DOCUMENTS

| 3,700,510 A | * | 10/1972 | Keene et al. | |
|---|---|---|---|---|
| 3,732,792 A | * | 5/1973 | Tarnopol et al. | 95/1 R |
| 5,387,493 A | * | 2/1995 | Imabayashi et al. | 430/280 |
| 6,338,937 B1 | * | 1/2002 | Shirai et al. | 430/313 |

* cited by examiner

Primary Examiner—Cathy Lam
(74) Attorney, Agent, or Firm—William N. Hogg (57) ABSTRACT

A printed circuit board comprises a base substrate including a conductive circuit pattern on a top surface thereof, and at least one photosensitive resin layer positioned on the base substrate. The resin layer exposure is performed through a photomask having light-shielding and exposure amount adjusting portions as part thereof to accommodate for varying resin layer thicknesses.

8 Claims, 6 Drawing Sheets

Fig.9

PRINTED CIRCUIT BOARD, METHOD OF MAKING SAME, AND PHOTOMASK FOR USE IN THE METHOD

BACKGROUND OF THE INVENTION

The present invention relates to printed circuit boards and to methods of manufacturing printed circuit boards. More specifically, the invention relates to printed circuit boards including via holes and formed of a photosensitive resin. The invention also relates to photomasks for use in such manufacture.

As is known, printed circuit boards (PCBs) are used in various kinds of electronic equipment. Additionally, printed circuit boards which use via holes in order to provide electrical connections across interim insulating layers have been used to meet high density wiring requirements in many of today's equipment designs.

Figure 8:
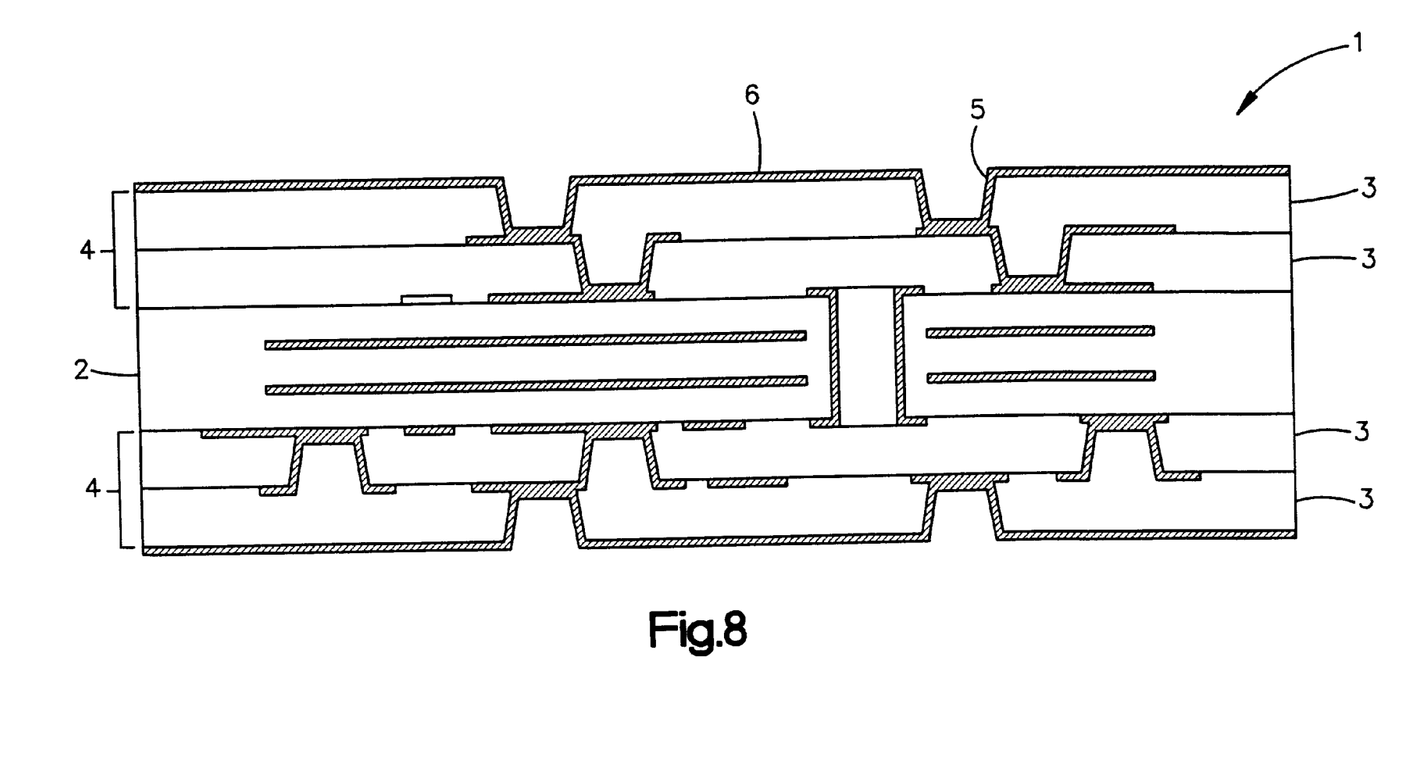
FIG. 8 is a sectional view of a conventional PCB.

FIG. 8 is a sectional view of a conventional PCB 1 using a via hole, the PCB including a base substrate 2 and a pair of built-up portions 4 formed of insulating resin layers 3, and located on both sides of the interim base substrate 2. In each of these built-up portions 4, via holes 5 and conductive circuit patterns 6 are formed. The base substrate 2 is formed of, for example, a multi-layered composite, which includes, for example, a glass epoxy substrate, or the like, with spaced internal conductive layers.

Each of the via holes 5 shown in FIG. 8 is formed in order to provide electrical connection across a thickness of the insulating resin layers 3. Heretofore, this via hole 5 was typically formed by a boring method such as mechanical drilling, laser drilling, or a photolithography method (hereinafter, referred to as a "photo via method"). Forming the resin layer 3 of portion 4 may be accomplished by resin coating, laminating a film-shaped resin, and the like. Of these methods, the photo via method, which uses photosensitive resins and photolithographic processing, is considered particularly suitable to meet the high densification and high integration requirements for such boards.

Figure 9:
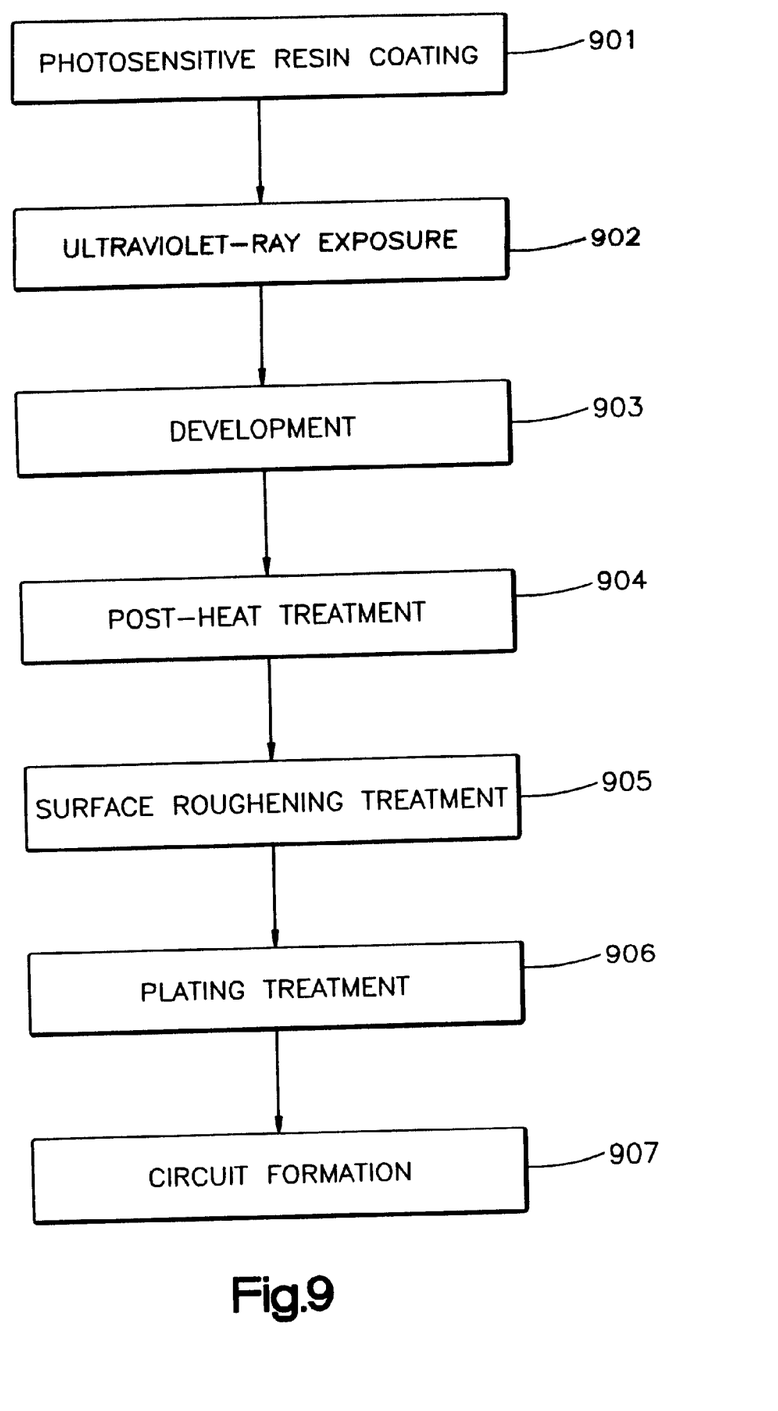
FIG. 9 is a flowchart showing a manufacturing method for a conventional PCB.

FIG. 9 shows a manufacturing method for a PCB, in which the via holes are formed by a conventional photo via method. As shown in FIG. 9, an insulating photosensitive resin is provided (coated on a base substrate having a fine circuit formed on its surface) in Step 901. Next, in Step 902, imaging exposure is performed on the photosensitive resin with ultraviolet rays through a photomask. Then, in Step 903, the unexposed and uncured photosensitive resin is developed and removed by use of known liquid developer, to form a via hole. Thereafter, in Step 904, the resin layer is subjected to heat treatment to stabilize various characteristics thereof. A surface roughening treatment of the layer next occurs, followed by plating, e.g., using a method such as non-electrolytic plating. Circuit formation is performed in Step 907, thus forming a fine circuit. These steps can be repeated any number of times depending on the number of layers desired, to thus produce a built-up multi-layered PCB.

In recent years, via holes (i.e., 5 in FIG. 8) formed in the above-described process have been manufactured as small in diameter as defined by the resolution limit of the insulating photosensitive resin used for the layers. Occasionally, there occurs unevenness in the thickness of the photosensitive resin layer. If this occurs in an area where an underlying conductive circuit pattern is present, the photosensitive resin forming the insulating layer 3 may not be fully developed and removed, possibly resulting in incomplete via hole formation, and thus a defective final product. Understandably, this can prove extremely costly when producing PCBs having many individual layers. The defect may be in the form of a failed connection, e.g., to the conductive circuit pattern formed on the layer's upper surface. Accordingly, to meet the high density wiring requirements of today's PCBs, uneven layer thicknesses must be minimized; that is, the insulating layers must be as flat (planar) as possible. It has been determined that a thickness variation of 5 micrometers or less, (preferably 3 micrometers or less) is acceptable for many of today's designs. Heretofore, the film unevenness has reached about 17 micrometers in some cases, depending on the shape and the thickness of the conductive circuit pattern and the properties of the photosensitive resin. To reduce such unevenness, polishing the surface of the photosensitive resin layer before the aforementioned developing step has occurred. However, this polishing step has resulted in scratch formation in the surface of the photosensitive resin layer, which can adversely affect the subsequent developing step.

It is believed, therefore, that a new method of making a PCB which overcomes the problems described above would constitute an advancement in the art. The resulting board and the mask used in such a process would also represent art advancements.

OBJECTS AND SUMMARY OF THE INVENTION

A primary object of the present invention is to provide an improved PCB construction and method for making same.

Another object is to provide a method which assures greater process yields, without causing incomplete via holes during the formation of via holes, and further without defects such as a circuit short or a circuit disconnect during formation of a subsequent conductive circuit pattern.

Further, another object of the present invention is to provide a new and improved photomask adaptable for use in such a method.

Specifically, according to one aspect of the present invention, provided is a PCB comprising a base substrate including a conductive circuit pattern on a surface thereof and at least one resin layer provided on the base substrate, wherein the resin layer is formed of a photosensitive resin. The printed circuit board is formed by exposing the photosensitive resin layer on the conductive circuit pattern with an amount of exposure dependent on the area of the associated conductive circuit pattern.

According to another aspect of the invention, there is provided a method of manufacturing a PCB which comprises the steps of coating a photosensitive resin on a base substrate including a conductive circuit pattern on a surface thereof. Light is exposed onto a position of the conductive circuit pattern with an exposure amount in accordance with an area of the conductive circuit pattern. The exposed photosensitive resin is developed to remove a layer of the photosensitive resin on the conductive circuit pattern in accordance with the area of the conductive circuit pattern, thus setting a film thickness difference of the layer of the photosensitive resin from the surface of the base substrate to 5 micrometers or less.

According to yet another aspect of the invention, there is provided a photomask for exposing a photosensitive resin layer, which comprises a light shielding portion corresponding to a portion of the photosensitive resin layer below which the conductive circuit pattern is not formed, an exposure quantity adjusting portion formed of a fine pattern in accordance with an area of the conductive circuit pattern in a position of the conductive circuit pattern, and a light shielding portion for forming a via hole.

BRIEF DESCRIPTION OF THE DRAWINGS

For a more complete understanding of the present invention and the advantages thereof, reference is now made to the following description taken in conjunction with the accompanying drawings, in which like numerals are used to depict like features.

FIGS. 3(a) to 3(e) are views showing various embodiments of fine patterns which may be formed by the exposure step according to one embodiment of the invention.

DETAILED DESCRIPTION OF THE PREFERRED EMBODIMENT

Description will be made below for the present invention based on the embodiments shown in the drawings. However, it is understood that the present invention is not limited to these embodiments. Like numerals are used from FIG. to FIG. to identify like features.

Figure 1:
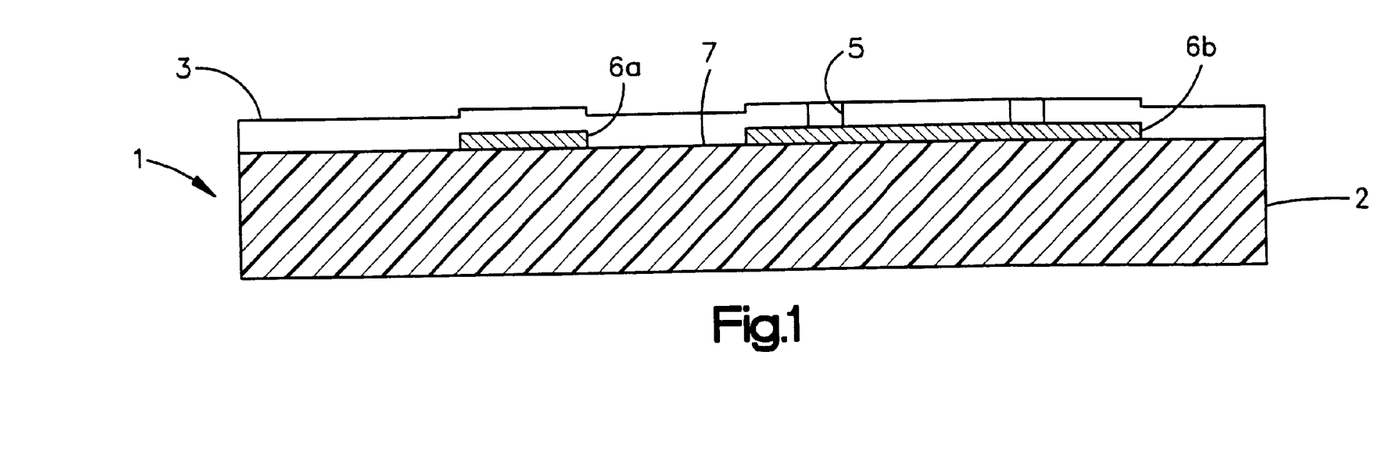
FIG. 1 is a sectional view showing an insulating layer comprised of photosensitive resin coated on a base substrate, according to one aspect of the present invention.

FIG. 1 is a sectional view showing a state where an insulating layer 3 comprised of photosensitive resin is applied on a base substrate 2 according to one aspect of the present invention. Base substrate 2 may be of glass-epoxy dielectric with a desired number of internal conductive layers (e.g., signal or ground planes) such as represented in FIG. 8. As a photosensitive resin for layer 3 of the present invention, a photopolymeric resin such as an acrylic resin, an epoxy resin, a polyimide resin and the like can be used. Particularly in the present invention, a so-called photopolymeric resin obtained by polymerizing epoxy or polyimide resin with light is preferable in terms of desired electrical properties. Substrate 2 also includes a desired conductive circuit pattern comprised of conductors 6a and 6b, and others (not shown) if needed. This pattern may be formed using conventional processing. Conductor 6a is shown of narrower width than adjacent conductor 6b for illustration purposes. Many conductors of differing and/or similar widths may be formed on substrate 2.

The above-described resin used in the present invention is not particularly limited, and any resin such as a bisphenol A type epoxy resin, an epoxy resin containing an alicyclic epoxy group, a phenol epoxide resin, an epoxy resin containing cyclic siloxane, a polyimide resin and the like can be used as long as these assure the necessary electrical properties for the finished PCB as produced herein.

In order to photopolymerize the epoxy resin, photocationic polymerization is effective. As a photocationic polymerization initiator for use in such photocationic polymerization, compounds such as diazonium salts, diallyl iodonium salts, triallyl sulfonium salts, triallyl selenonium salts, silanol/aluminum complex, benzoin tosylate, o-nitrobenzyl tosylate, iron-arene complex, sulfonic ester and imide sulfonate, and derivatives of these compounds can be successfully used.

Moreover, a photopolymerization characteristic can be imparted to a polyimide resin, if used, by introducing a photolytic functional group such as an acrylic, methacrylic or azide. As a photopolymerization initiator, various substances including a radical polymerization initiator can be used.

The above-described photosensitive resin, either in a state of being dissolved in an appropriate solvent, or by using a non-solvent system if possible, is coated on the base substrate 2 by coating means, for example, a curtain coater (known), with the thickness between 30 micrometers and 50 micrometers. The insulating layer 3 (FIG. 1) formed of the photosensitive resin covers the conductive circuit pattern (conductors 6a and 6b) formed on base substrate 2. As seen, the insulating layer 3 forms slight mounds over respective ones of these conductors. Furthermore, between the narrower circuit conductor 6a and the wider circuit conductor 6b, the thickness of insulating layer 3 may vary due to influences such as the surface tension of the insulating layer 3 relative to the upper surface 7 of base substrate 2. Between the circuit conductor 6a and conductor 6b, thickness variation of insulating layer 3 may range substantially, if the conductors are formed of copper or the like material. By way of example, in the case where the thickness of the conductors is 18 micrometers, the difference in thickness of the insulating layer may be as much as 8 to 9 micrometers. In the case where the thickness of the circuit conductors is 35 micrometers, the difference in thickness of the insulating layer on the circuit pattern may be as much as about 15 to 17 micrometers.

For this reason, forming the via hole 5 above a conductor such as 6b having a relatively wide area and using a conventional exposure/development system (that is, where the entire surface of the base substrate 2 is developed under the same developing conditions) may result in incomplete removal of uncured resin in the portion where the insulating layer 3 is relatively thicker than other portions thereof, thereby resulting in incomplete via hole formation.

Figure 2:
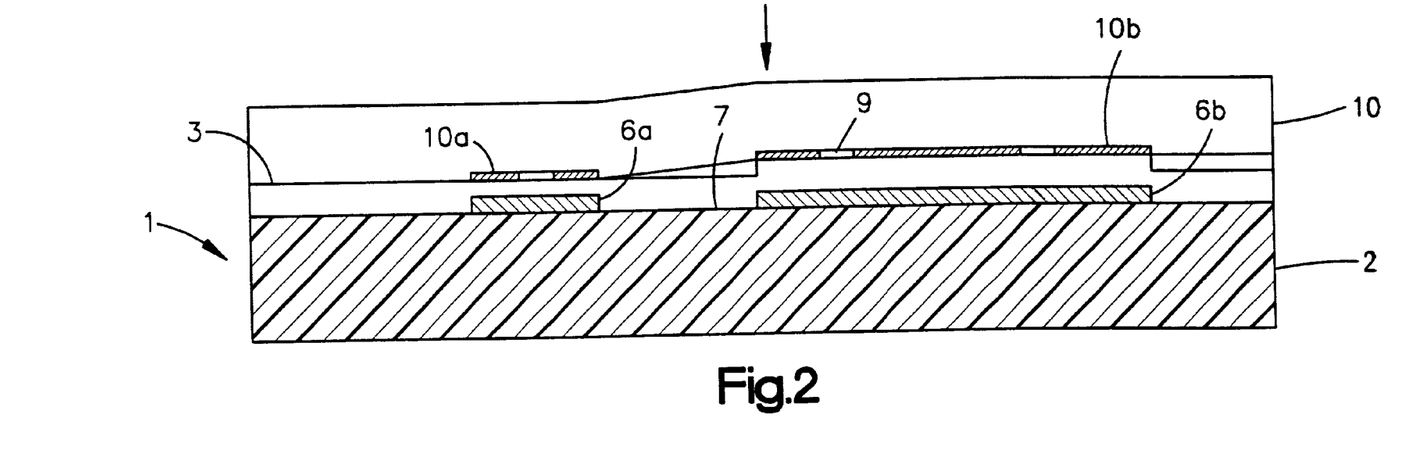
FIG. 2 is a sectional view of the FIG. 1 structure, showing a state where exposure is performed on the base substrate according to one aspect of the present invention.
Figure 3A:
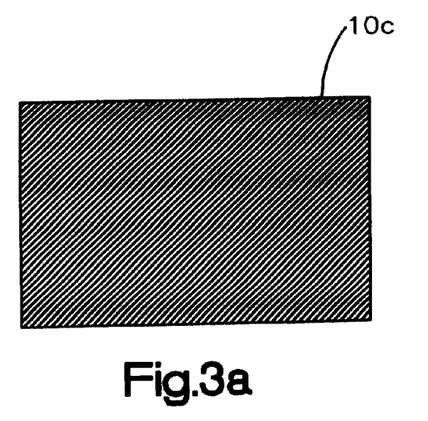
Figure 3B:
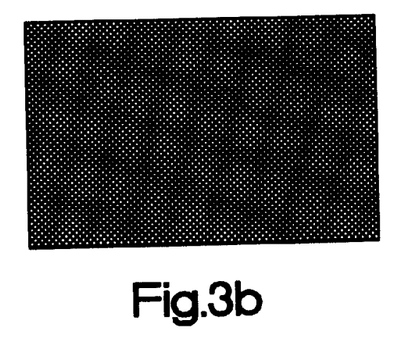
Figure 3C:
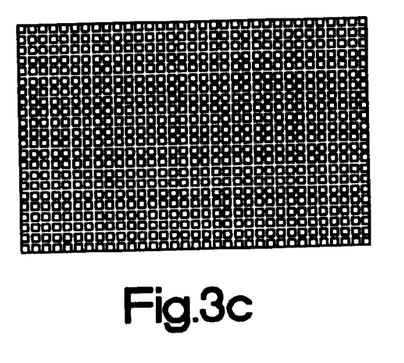
Figure 3D:
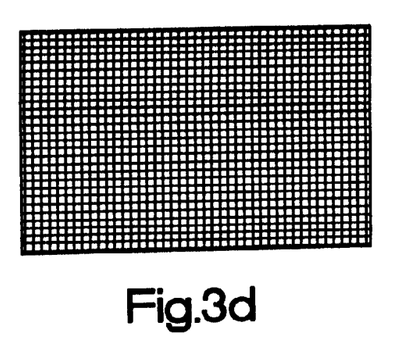
Figure 3E:
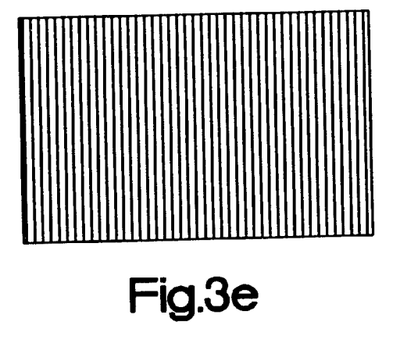

FIG. 2 illustrates a state where exposure is performed on the base substrate 2 coated with insulating layer 3 (as shown in FIG. 1) by a manufacturing method according to one aspect of the present invention. To achieve this, conventional exposure apparatus can be used. For example, an exposure apparatus of a contact exposure type, which uses a light source emitting collimated light (such as a metal halide lamp or high-pressure mercury lamp from $1.5 \times 10^4$ to $3.0 \times 10^4$ $J/m^2$) may be used. As shown in FIG. 2, ultraviolet rays 8 from the exposure apparatus (not shown) are directed onto the photosensitive resin of insulating layer 3, through a photomask 10. A slight spacing between photomask 10 and the upper surface of layer 3, is seen in the region surrounding conductor 6b in view of the raised level of the layer at this location. A lesser spacing may also occur adjacent layer 3 atop conductor 6a.

Photomask 10 includes a light shielding portion 9 (for forming the via hole or holes 5) and exposure quantity adjusting portions 10a and 10b corresponding to the areas of the conductive circuit pattern conductors 6a and 6b, respectively.

The insulating layer 3, as seen in FIG. 2, is coated relatively thinly over the conductive circuit pattern conductor 6a (having the narrower area), and coated relatively thicker over the a conductive circuit pattern conductor 6b (having a much wider top surface area). The thickness of insulating layer 3 reaches about 8 to 9 micrometers over a conductive circuit pattern formed of copper with a thickness of about 18 micrometers, and, in the case where the thickness of the conductive circuit pattern formed of copper is about 35 micrometers, the thickness of insulating layer 3 reaches about 15 to 17 micrometers. Therefore, if photomask 10 has shielding portions just for forming via holes over both the conductive circuit pattern conductors 6a and 6b, and if equal light-exposing and developing conditions are applied, it becomes relatively difficult to remove some of the photosensitive resin (which may not be fully cured) from the bottom part of the via hole(s) formed over the wider conductive circuit pattern 6b. The obvious result is that an additional step may be necessary to effect complete removal, adding to the cost of the final product.

In the present invention, exposure quantity adjusting portions 10a and 10b are provided in areas of photomask 10, corresponding to the conductive circuit pattern conductors 6a and 6b, at a thickness in accordance with the surface areas thereof. Portion 10b is seen as being thicker than portion 10a, to thereby compensate for thickness variations in the underlying resin layer 3. Further, the wider the conductor, the thicker the corresponding adjusting portion. (Mask 10 is seen as also including light shielding portions over the surface 7 of substrate 2 on which no circuit pattern conductors are found.) In the region of mask 10 atop narrower conductive circuit pattern 6a (the portion where the thickness of the insulating layer resin is small), the exposure quantity adjusting portion 10a is formed so that the film thickness reduction of the photosensitive resin layer is kept to a minimum (compared to portion 10b). In the region of wide conductive circuit pattern conductor 6b (the portion where the thickness of the insulating layer resin is greater), the exposure quantity adjusting portion 10b is formed so that the film thickness reduction of the photosensitive resin layer will be greater than for portion 10a. Thus, the defect of the incomplete via hole due to the difference in the thickness of the insulating layer is prevented.

In the present invention, various patterns of the above-described exposure quantity adjusting portions can be formed, with FIGS. 3(*a*) to 3(*e*) showing different embodiments of same (represented by the numeral 10c in FIG. 3(*a*)).

As understood from FIGS. 3(*a*) to 3(*e*), the number of possible different fine patterns is several, provided the patterns formed are consistent with the underlying conductor patterns. That is, the fine pattern formed of each exposure quantity adjusting portions 10a and 10b is uniformly disposed in the shape corresponding to that of the conductive circuit patterns 6a and 6b. Uniform exposure through the resin layer atop conductors 6a and 6b is thus assured.

Figure 4:
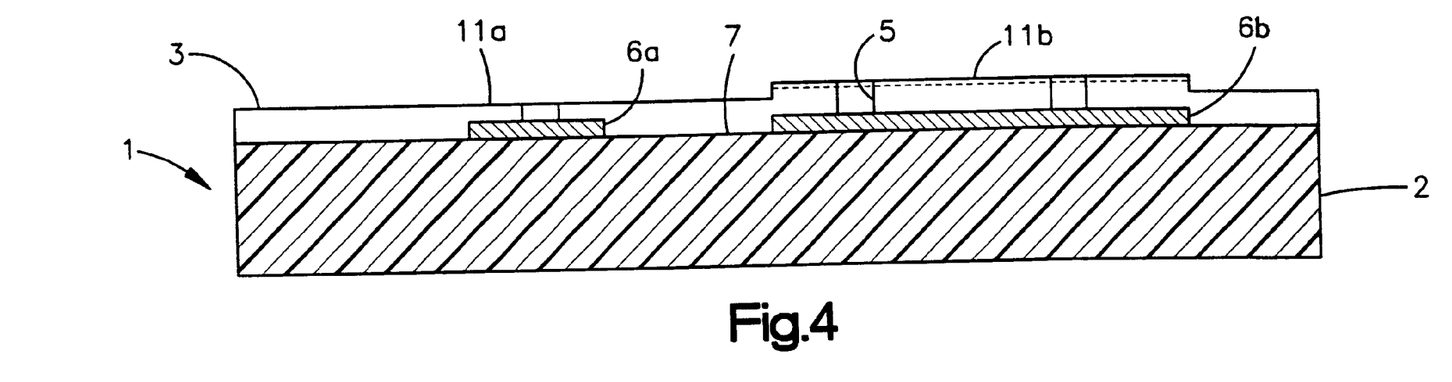
FIG. 4 is a sectional view showing the structure of FIG. 2 illustrating the curing step of one embodiment of the invention.

FIG. 4 is a sectional view showing the step where the resin layer of the built-up printed circuit board 1 produced by the manufacturing method of the present invention is exposed and cured of the resin layer. In FIG. 4, dark spots denoted by reference numeral 11a and 11b represent uncured (unexposed) portions of the resin layer. As shown, the insulating layer 3 has a relatively smaller uncured portion 11a (except for the portion corresponding to the via hole). On the other hand, the insulating layer atop conductor 6b has a relatively deeper uncured portion 11b.

Figure 5:
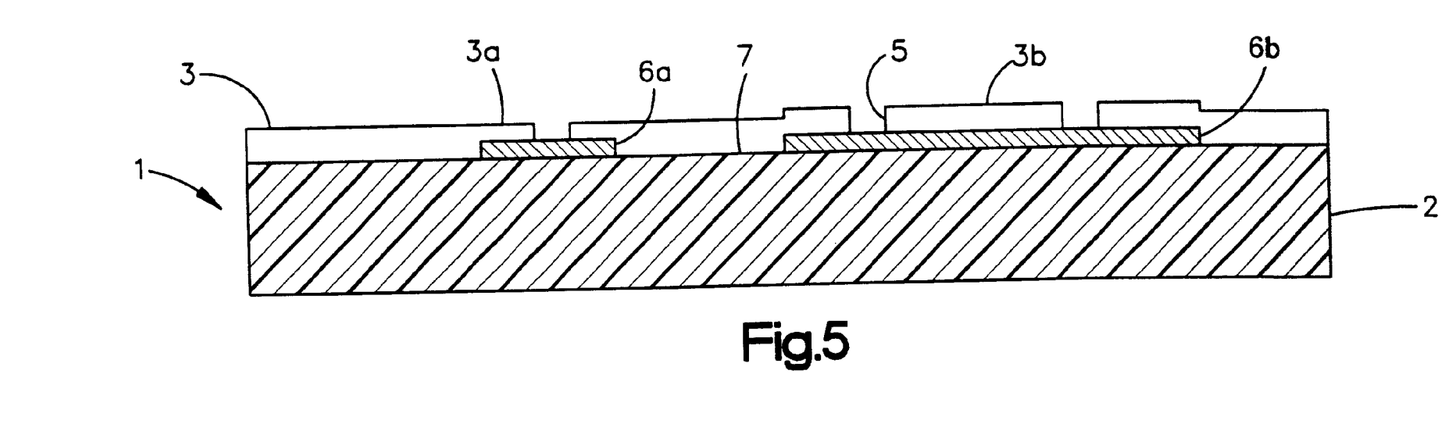
FIG. 5 is a sectional view showing the FIG. 4 structure in which the insulating layer has been subjected to a development step after the exposure step according to one embodiment of the invention.

FIG. 5 is a sectional view showing insulating layer 3 as having been developed (portions removed) after exposure. Any known developing process can be used, such as a solvent development or a conveyor spray type developing system operating at a temperature from about 25 to 35 degrees Celsius for about 2 to 5 minutes. As shown in FIG. 5, the top surface of the insulating layer corresponding to both the narrow and wider conductive circuit pattern conductors located thereunder is exfoliated slightly after development. As a result, the aforementioned differences in thickness of the insulating resin layer after development are substantially eliminated. In the present invention, following a post-heat treatment process, the PCB will have approximately the same height from the base substrate at both insulating layer portions 3a and 3b. By way of example, the difference in thickness from the base substrate to insulating layer portions 3a and 3b may be 5 micrometers or less, and most preferably 3 micrometers or less, which are considered acceptable.

Figure 6:
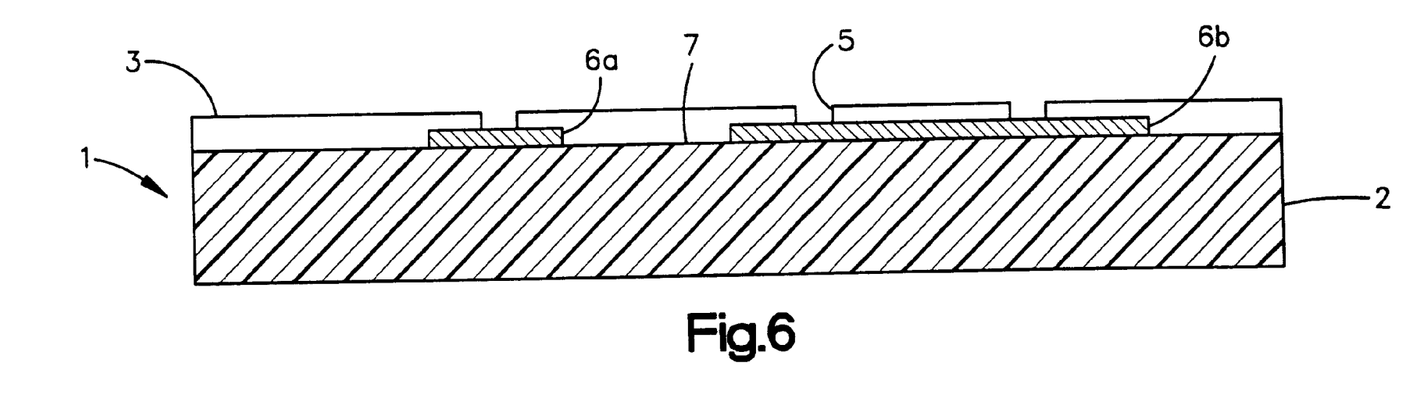
FIG. 6 is a sectional view showing the FIG. 5 structure in which the insulating layer has been subjected to a post-curing step according to one embodiment of the present invention.

FIG. 6 is a view showing insulating layer 3 that has been subjected to the aforementioned post-heat treatment process, following developing. As shown in FIG. 6, the slight unevenness (3a, 3b in FIG. 5) on the top surface of insulating layer 3 is smoothed as a result of flowing of the photosensitive resin caused by the heat of said process. It is thus seen that a good insulating layer can be formed without unevenness of thickness using the teachings herein. Moreover, the insulating layer 3 is further cured by the post-heat treatment process, thereby increasing the stability thereof. In the present invention, post-heat treatment can be performed at any temperature for any period of time as long as the temperature is sufficient to fluidize the upper portions of the resin layer. Therefore, according to the present invention, the defect of incomplete via holes can be prevented, and further, defects such as a short circuit and/or circuit disconnection in the subsequent conductive circuit pattern are also prevented. A polishing process is not needed. In the present invention, during the time between the described exposure and development steps, a reaction accelerating treatment (such as heating) can also be performed if desired.

The aforementioned steps can be repeated as necessary to provide a completed PCB with a desired number of conductive and insulative layers. Additionally, the various openings (via holes 5) can also be made conductive by application (e.g., plating) of a conductive metal layer (e.g., copper) on the walls thereof. Examples of plated holes were described above with respect to the board of FIG. 8.

Figure 7:
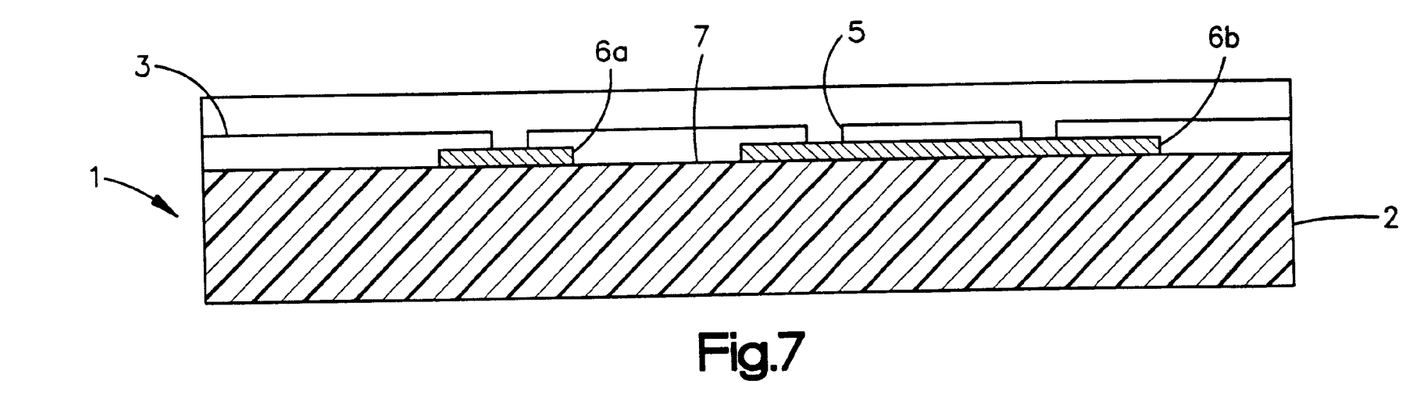
FIG. 7 is a sectional view showing a resulting built-up PCB from the structure shown in FIG. 6.

FIG. 7 is a sectional view showing a built-up PCB 1 manufactured according to the method of the present invention. As shown in FIG. 7, the insulating layers (3, and the layer atop 3) of the built-up portion (the entire structure above substrate 2) have approximately the same film thickness, and may be of the same insulative material.

The above description has been made for the present invention based on the embodiments shown in the drawings. However, the present invention is not limited to these embodiments. The present invention is applicable to any kind of PCBs of known composition as long as the advantages taught herein are attainable. As also described above, the present invention includes the defined manufacturing method, the resulting PCB and the photomask for use in the method.

Although the preferred embodiment of the present invention has been described in detail, it should be understood that various changes, substitutions and alternations can be made therein without departing from spirit and scope of the inventions as defined by the appended claims.

What is claimed is:

1. A printed circuit board comprising:
   a base substrate including a conductive circuit pattern on a surface thereof; and
   at least one photosensitive resin layer provided on said base substrate and positioned substantially over said conductive circuit pattern, said printed circuit board being formed by exposing said photosensitive resin layer on said conductive circuit pattern with an exposure amount in accordance with a predetermined area of said conductive circuit pattern, said area of said conductive circuit pattern is performed by the use of a photomask in which a light shielding portion of a fine pattern is formed in a portion corresponding to a portion of said conductive circuit pattern, and a film thickness difference of said photosensitive resin layer from the surface of the base substrate after the exposure is set to be 5 micrometers or less.

2. The printed circuit board according to claim 1, wherein said photosensitive resin includes any one of an epoxy resin and a polyimide resin.

3. The printed circuit board according to claim 1, wherein said printed circuit board is a buildup printed circuit board.

4. A photomask for exposing a photosensitive resin coated on a base substrate including a conductive circuit pattern on a surface thereof, and wherein said resin is located substantially atop said circuit pattern, said photomask comprising:
   light shielding portion corresponding to a portion of said photosensitive resin under which said conductive circuit pattern is not formed;
   an exposure amount adjusting portion formed of a fine pattern in accordance with the area of said conductive circuit pattern on said surface of said base substrate and located over said conductive circuit pattern; and
   light shielding portions positioned over selected parts of said conductive circuit pattern for exposing via holes in said photosensitive resin down to said circuit pattern, and a film thickness difference of said photosensitive resin layer from the surface of the base substrate after exposure is set to be 5 micrometers of less.

5. A manufacturing method for making a printed circuit board, said method comprising the steps of:
   coating a photosensitive resin on a base substrate including a conductive circuit pattern on a surface thereof;
   exposing light on a position of said conductive circuit pattern with an exposure amount in accordance with a predetermined area of said conductive circuit pattern; and
   developing said exposed photosensitive resin to remove a portion of said photosensitive resin on said conductive circuit pattern in accordance with the area of said conductive circuit pattern, thus setting a film thickness difference of the layer of said photosensitive resin from the surface of the base substrate to 5 micrometers or less.

6. The manufacturing method for making a printed circuit board according to claim 5,
   wherein said exposing step in accordance with the area of said conductive circuit pattern includes a step of performing exposure through a photomask having an exposure quantity adjusting portion formed with a fine pattern and a light shielding portion for forming a via hole provided therein, and
   said exposing step further includes a step of executing a post-heat treatment after the development.

7. The manufacturing method for making a printed circuit board according to claim 5, wherein said photosensitive resin is comprised of an epoxy resin or a polyimide resin.

8. The manufacturing method for making a printed circuit board according to claim 5, wherein said printed circuit board is a buildup printed circuit board.

* * * * *